United States Patent
Nathan

(10) Patent No.: US 6,918,311 B2
(45) Date of Patent: Jul. 19, 2005

(54) WEATHER RESISTANT AUTOMATIC METER READING UNIT

(75) Inventor: Gil Nathan, Rishon le Zion (IL)

(73) Assignee: M&FC Holding, LLC, Raleigh, NC (US)

( * ) Notice: Subject to any disclaimer, the term of this patent is extended or adjusted under 35 U.S.C. 154(b) by 0 days.

(21) Appl. No.: 09/956,865

(22) Filed: Sep. 21, 2001

(65) Prior Publication Data

US 2002/0041237 A1 Apr. 11, 2002

Related U.S. Application Data

(60) Provisional application No. 60/234,328, filed on Sep. 22, 2000.

(51) Int. Cl.[7] ................................................ G01D 7/02
(52) U.S. Cl. .................................................... 73/866.1
(58) Field of Search .................. 73/866.1; 340/870.02; 429/100; 206/703, 705, 706; 361/659

(56) References Cited

U.S. PATENT DOCUMENTS

| | | | | |
|---|---|---|---|---|
| 4,365,232 A | * | 12/1982 | Miller ....................... 340/27 R |
| 5,476,731 A | * | 12/1995 | Karsten et al. ................ 429/97 |
| 5,602,744 A | * | 2/1997 | Meek et al. ............. 364/464.22 |
| 5,633,096 A | * | 5/1997 | Hattori ........................... 429/7 |
| 5,769,657 A | * | 6/1998 | Kondo et al. ................ 439/500 |
| 5,877,703 A | * | 3/1999 | Bloss, Jr. et al. ........ 340/870.02 |
| 5,935,729 A | * | 8/1999 | Mareno et al. .............. 429/100 |
| 6,007,939 A | * | 12/1999 | Clowers ........................ 429/99 |
| 6,071,640 A | * | 6/2000 | Robertson et al. ........... 429/100 |
| 6,100,816 A | * | 8/2000 | Moore ................... 340/870.02 |
| 6,111,519 A | * | 8/2000 | Bloss, Jr. et al. ........ 340/870.02 |
| 6,366,217 B1 | * | 4/2002 | Cunningham et al. . 340/870.31 |
| 6,453,757 B1 | * | 9/2002 | Montag et al. ........... 73/861.28 |
| 2002/0041237 A1 | * | 4/2002 | Nathan |
| 2002/0109607 A1 | * | 8/2002 | Cumeralto et al. |

FOREIGN PATENT DOCUMENTS

JP 08327425 A * 12/1996 ............. G01F/3/22

* cited by examiner

Primary Examiner—Charles Garber
(74) Attorney, Agent, or Firm—Bacon & Thomas

(57) ABSTRACT

A chassis for a residential utility meter reading unit includes individual chambers including a transmitter chamber containing a printed circuit board, an indexing unit chamber containing the mechanism for operating dials that rotated in response to use of the utility product to indicate the magnitude of consumption, and a battery chamber releasably connected to the chassis and adapted to complete an electrical connection between batteries and circuit board as the third chamber moves relative to the chassis. A transparent cover overlaps a slot formed in the chassis and a leg extending from the battery chamber moveable in the slot. Rails on the chassis block movement of sliders on the battery pack away from the chassis to prevent disengagement of the battery chamber from the chassis unless the cover and its attachment screws are first removed.

1 Claim, 3 Drawing Sheets

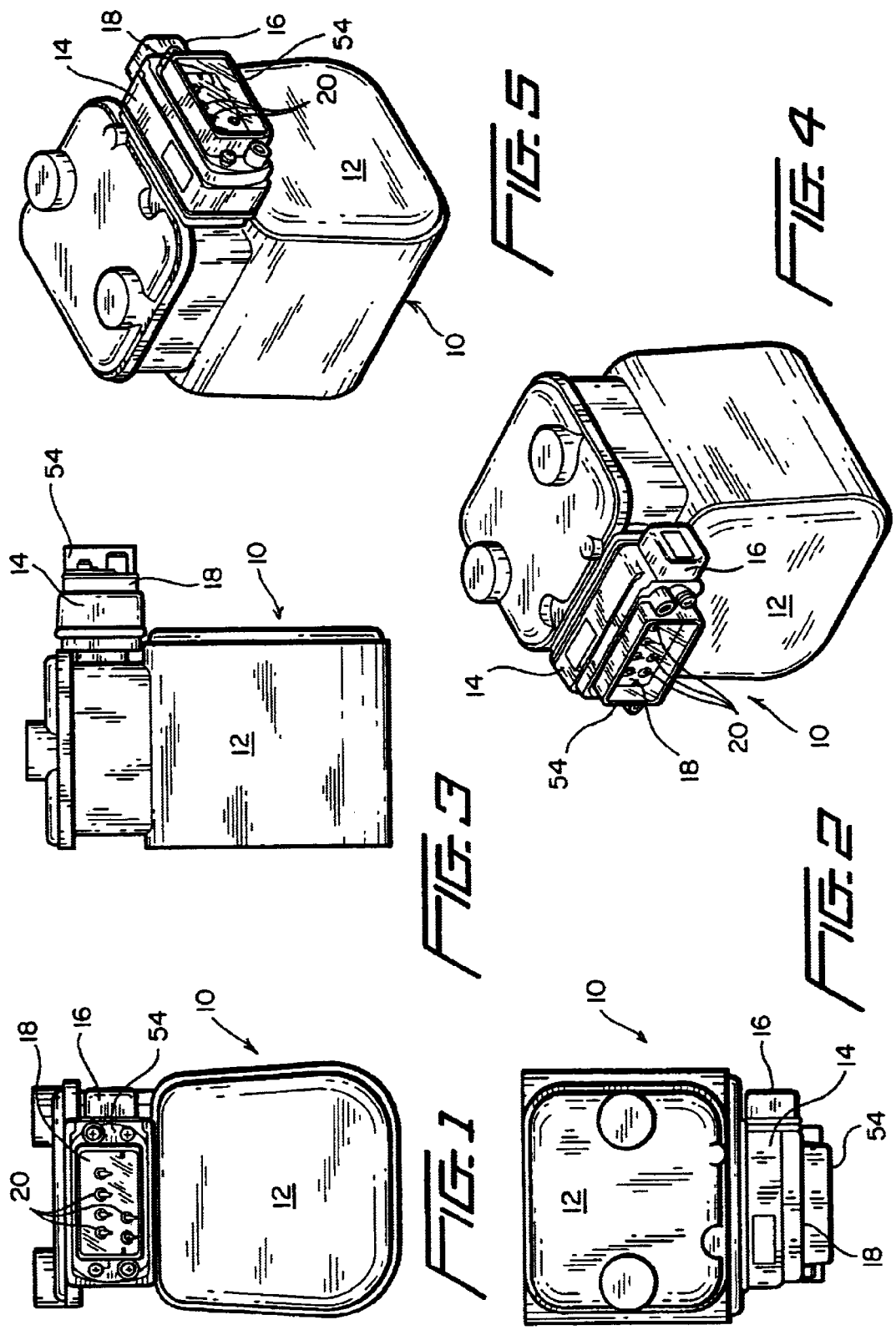

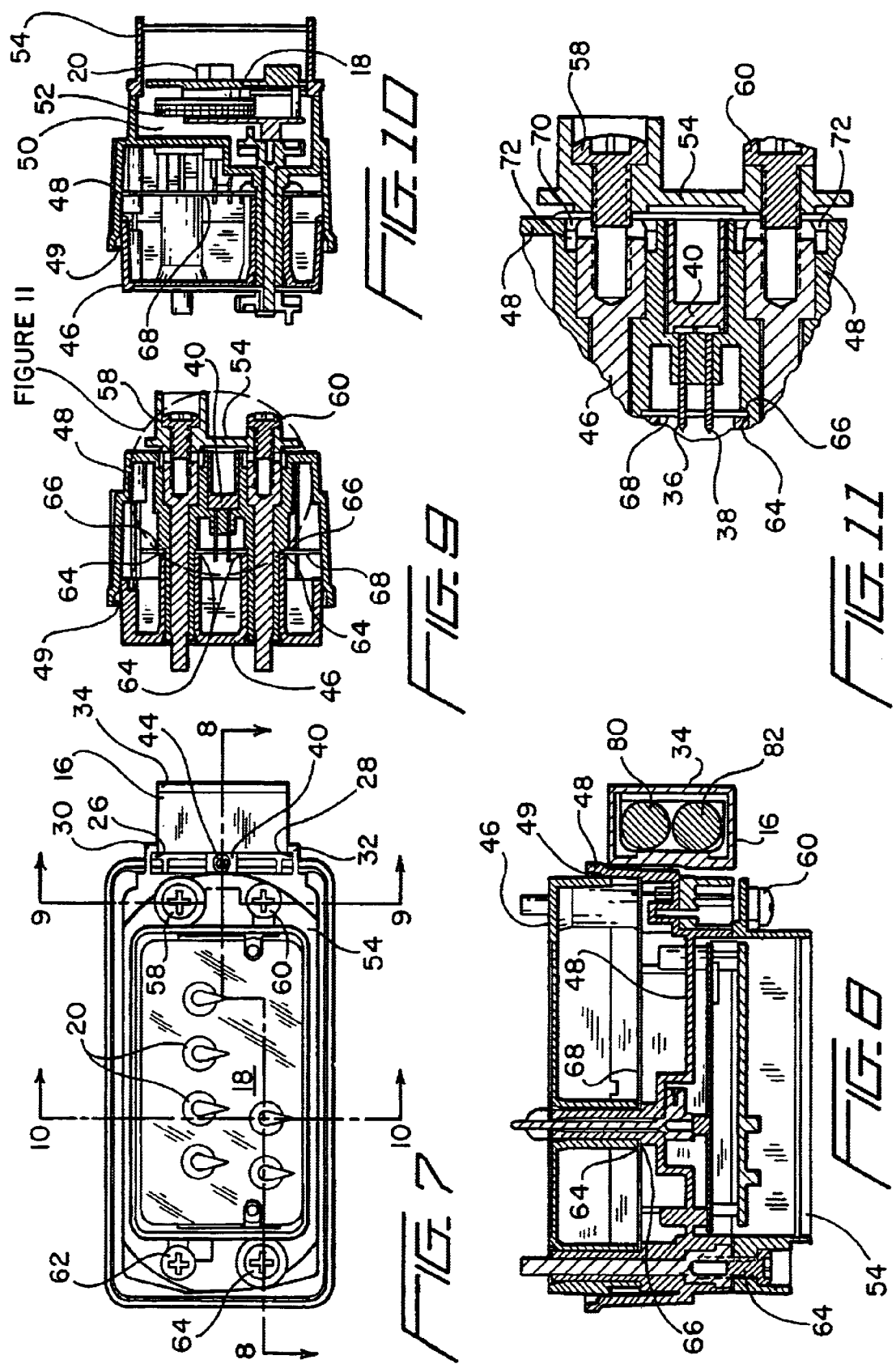

WEATHER RESISTANT AUTOMATIC METER READING UNIT

This application claims the benefit under 35 USC 119(e) of provisional application No. 60/234,328, filed Sep. 22, 2000.

BACKGROUND OF THE INVENTION

1. Field of the Invention

This invention relates to the field of automatic meter reading units, AMR units, particularly to such units having replaceable battery packs.

2. Brief Description of the Prior Art

Currently, the most common method used by utility providers to determine the quantity of electricity, gas and water utility product used by a residential customer services is to read manually each customers' meter. Most of the meters are mechanical. The flow of electricity, water or gas induces a disk to rotate. That rotation forces a set of gears to scroll, which mechanically displays the usage. The staff reading the meters walks from residence to residence, writes down the current consumption showing on the meter, and inputs the information into a billing computer, which generates the individual bills mailed to the customers.

A network, a one way SSDS (spread spectrum direct sequence) network for minimizing the life cycle cost of the system, has been proposed to provide a valid alternative to conventional meter reading and existing AMR technologies. That network consists of a large number of transmitters connected to the meters, transmitting in SSDS packets the readings of the utility consumption; a network of SSDS receivers, each receiver monitoring tens of thousands of transmitters, obtaining the transmitted data packets, compressing the SSDS modulation and storing the data; and a network control center, which collects the data from the receivers via a dial-up line or any low cost communication means, stores the data in a protected database, and prepares it for billing. The network transmitters use a single PCB design, a novel BPSK modulator, low-cost frequency reference, and printed low cost antennae including the matching circuits.

Residential meters, such as utility meters for use with such a network, operate with transmitters having batteries, which must be replaced periodically. Water or moisture, which can produce corrosion, enter the meter box and reach the printed circuit board (PCB) located there, is a problem associated with battery replacement. With the present invention, battery replacement is made faster and safer without water penetration to the PCB or the metal contacts.

SUMMARY OF THE INVENTION

It is an object of this invention that the battery cells not be assembled in the same chamber with the printed circuit board or index mechanism in order to prevent water entry to the area of the transmitter and index electronics during the process of replacing the batteries or while maintaining the index mechanism.

It is another object of this invention to provide a meter reading unit in which battery replacement requires removing the securing plastic seals, removing the screws holding a transparent front cover, replacing the battery pack, reinstalling the screws and seals, and injecting silicon grease to the electric contact seal to avoid corrosion.

It is yet another object of this invention that the battery pack be protected against any unauthorized access without first removing two front plastic access seals, securing screws and a transparent cover to access the battery pack.

In realizing these objects and advantages a weather resistant automatic meter reading unit according to this invention includes a chassis divided into chambers; a first chamber containing a printed circuit board having a first terminal for connection to an electrical power source; and a second chamber sealed from the first chamber, sized to contain and hold batteries, having a second terminal electrically connectable to the batteries, moveable relative to the chassis, adapted to complete an electrical connection between the first terminal and second terminal as the second chamber moves relative to the first chamber, and releasably fixed to the chassis.

BRIEF DESCRIPTION OF THE DRAWINGS

Eighteen figures have been selected to illustrate a preferred embodiment of the invention.

FIG. 1 is a front view of a gas meter assembly having an automatic meter reading unit installed.

FIG. 2 is a top front view of the assembly of FIG. 1.

FIG. 3 is a side view of the assembly of FIG. 1.

FIGS. 4 and 5 are isometric views of the assembly of FIGS. 1–3.

FIG. 7 is a front view of the automatic meter reading unit.

FIG. 8 is a cross section taken at plane 8—8 of FIG. 7.

FIG. 9 is a cross section taken at plane 9—9 of FIG. 7.

FIG. 10 is a cross section taken at plane 10—10 of FIG. 7.

FIG. 11 is a portion of the cross section shown in FIG. 9.

FIGS. 12 and 16 are isometric views of the battery pack portion of the automatic meter reading unit.

FIGS. 13, 14 and 15 are end, front and bottom views of the battery pack, respectively.

FIG. 17 is an isometric view of the battery pack case with the batteries and end cover removed.

FIG. 18 is an isometric view of the battery pack showing spring metal contacts adjacent the box, the end cover, batteries and battery case mutually spaced apart.

DESCRIPTION OF THE PREFERRED EMBODIMENT

Figure 6:
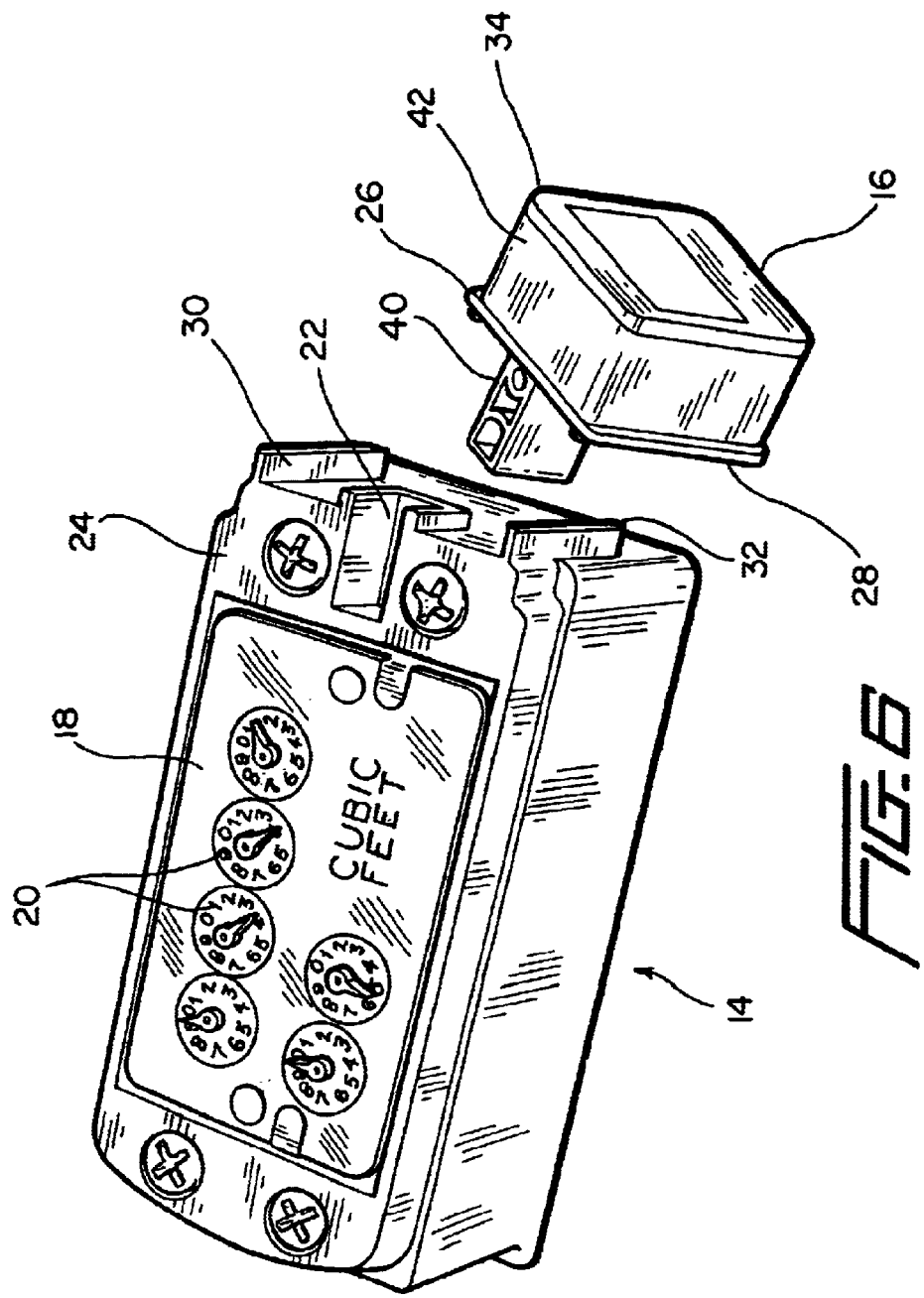
FIG. 6 is a photographic reproduction in perspective of the automatic meter reading unit.

Referring first to FIGS. 1–5, a residential utility meter reading unit 10 according to the present invention includes a box 12 containing mechanical components for producing an indication of the magnitude and rate of use of a utility product such as gas, water or electricity; a transmitter unit 14 mounted on the top of the box at its front; a battery pack 16 fixed to the transmitter unit; and an index mechanism 18 located at the front face of the transmitter having a series of dials 20, each having a rotating indicator pointing to a printed gradated scale representing the amount of consumed product and the current rate of its use by the residential customer.

FIG. 6 shows the transmitter unit 14 having its transparent cover, face plate and attaching screws removed to expose the index mechanism 18, which in this case is suited for use on a gas meter, and battery pack 16, removed from its slot 22 on the chassis front 24. In the assembled condition, the battery pack is guided for travel along slot 22 by fitting sliders 26, 28, located at the upper and lower edges of the pack, into rails 30, 32, formed integrally on the upper and lower edges of the chassis front. The battery pack is closed at its outer surface by a cover 34. Electric contact between the battery terminals and metal rivet contacts 36, 38, carried on the transmitter PCB, is completed when the leg 40 of the battery pack completes its travel to the lower, inner end of slot 22.

The battery pack 16 is completely sealed against moisture and the ambient environment due to its enclosing cover 42, end cover 34 and silicon grease, injected between the main enclosure of the chassis and battery pack at the greaser point 44 (best seen in FIG. 7).

Referring next to FIGS. 7–11, the transmitter unit is enclosed by rear cover 46 and front cover 48, which covers overlap and are sealed mutually by a seal 49, preferably a glued room temperature vulcanized rubber applied by a dispensing process in the manufacturing plant where the meter is assembled. A portion of the front cover defines a chamber 50 occupied by the rotating indicators 20 and the gears 52 that drive the indicators of the index mechanism 18. A transparent cover 54 covers the face of the index mechanism, and a face plate 56, is secured to the rear cover 46 by attachment screws 58–64. The cover 54 and face plate 56 overlap the slot 22 into which the leg 40 of the battery pack is inserted, thereby securing the battery pack and preventing its removal except by removing two front plastic access seals, the screws and removing the cover and face plate. The attachment screws 58–64 engage screw threads formed in the rear cover 46.

The rear cover 46 is formed with multiple shoulders 64, and the front cover 48 is formed with similar shoulders 66, adjacent and facing the shoulders 64. Located between the shoulders 64 and 66 and held in position on the shoulders, is the PCB 68 of the transmitter unit 14. The PCB supports metal rivet contacts 36, 38, which electrically connect the battery terminals to the PCB when the leg 40 of the battery pack 16 is fully inserted into the slot 22. A seal 70, fitted within a well 72 in the front cover below the transparent cover 54, seals the index unit and transmitter unit from the environment.

FIG. 8 shows two batteries cells 80, 82 standing upright in the battery pack, which in that figure is held in place in its operating position under the transparent cover 54. FIG. 18 shows two electric contracts strips 84, 86 preferably formed of spring metal and located at the lower end of the leg 40, each strip adapted to contact a metal rivet contact 36, 38 on the PCB when the battery pack is filly inserted in slot 22, thereby completing an electric connection between the battery cells and the PCB. The PCB 68 is separated physically from the index mechanism 18.

With the present invention, whenever it is necessary to replace the battery cells, the replacement requires only removing the securing plastic seals, removing the screws holding the transparent front cover, replacing the battery pack, reinstalling the screws and seals, and injecting silicon grease to the electric contact seal to avoid corrosion.

Although the form of the invention shown and described here constitutes the preferred embodiment of the invention, it is not intended to illustrate all possible forms of the invention. Words used here are words of description rather than of limitation. Various changes in the form of the invention may be made without departing from the spirit and scope of the invention as disclosed.

I claim:

1. A gas utility meter reading unit for producing an indication of the quantity of gas consumed, comprising:

a housing divided into chambers;

a first chamber containing a printed circuit board having a first terminal for connection to an electrical power source;

a second chamber sized to contain and hold at least one battery therein, having a second terminal electrically connectable to said at least one battery, moveable relative to said first chamber, adapted to complete an electrical connection between said first terminal and said second terminal as said second chamber moves relative to said first chamber, and releaseably fixed to said housing; and a cover overlapping the electrical contact of said first and second chambers, wherein:

said housing defines a first portion having a first free edge around a periphery of said housing, a second portion having a second free edge around a periphery of said housing, said second free edge directed toward said first portion and overlapping said first free edge, and a seal located in a space overlapped by said first and second portions and located near said first and second free edges;

said first portion is formed integrally with multiple first shoulders located within said first portion;

said second portion is formed integrally with multiple second shoulders located within said second portion, said second shoulders directed toward said first shoulders, a thin space being created between said first and second shoulders; and said printed circuit board having first and second surfaces, said first and second surfaces located between said first and second shoulders, whereby said printed circuit board is held in position inside said housing.

\* \* \* \* \*